United States Patent [19]

Eberle

[11] 4,214,204
[45] Jul. 22, 1980

[54] HIGH RATE, BATTERY TESTING APPARATUS AND METHOD

[75] Inventor: William J. Eberle, Reading, Pa.

[73] Assignee: General Battery Corporation, Reading, Pa.

[21] Appl. No.: 895,520

[22] Filed: Apr. 11, 1978

Related U.S. Application Data

[60] Continuation-in-part of Ser. No. 887,063, Mar. 16, 1978, Ser. No. 770,889, Feb. 22, 1977, and Ser. No. 697,786, Jun. 21, 1976, which is a continuation of Ser. No. 618,772, Oct. 2, 1975, Pat. No. 3,980,126, which is a continuation-in-part of Ser. No. 432,545, Jan. 11, 1974, Pat. No. 3,954,216, which is a continuation-in-part of Ser. No. 395,528, Sep. 10, 1973, Pat. No. 3,861,575, which is a division of Ser. No. 184,338, Sep. 28, 1971, abandoned, said Ser. No. 770,889, is a continuation of Ser. No. 600,840, Jul. 31, 1975, Pat. No. 4,027,797, which is a division of Ser. No. 475,273, May 31, 1974, Pat. No. 3,938,368.

[51] Int. Cl.² .......................................... G01N 27/46
[52] U.S. Cl. .................................. 324/437; 320/48; 324/73 R
[58] Field of Search ............... 324/29.5, 158 P, 73 R, 324/73 AT; 320/48

[56] References Cited

U.S. PATENT DOCUMENTS

| | | | |
|---|---|---|---|
| 668,320 | 2/1901 | Rose | 228/53 |
| 1,171,232 | 2/1916 | Muller | 228/53 |
| 1,295,750 | 2/1919 | Hibbs | 228/51 |
| 1,937,303 | 11/1933 | Worrall | 193/33 |
| 2,360,950 | 10/1944 | Kilgour | 154/42 |
| 2,454,053 | 11/1948 | Galloway | 22/203 |
| 2,667,062 | 1/1954 | Johns | 72/40 |
| 2,759,445 | 8/1956 | Winkel | 113/59 |
| 3,000,519 | 9/1961 | Purnell | 214/11 |
| 3,017,570 | 1/1962 | Floyd | 324/29.5 |
| 3,170,572 | 2/1965 | Harrison | 209/74 |
| 3,259,525 | 7/1966 | Wilson | 136/176 |
| 3,493,035 | 2/1970 | Tiegel | 164/334 |
| 3,529,463 | 9/1970 | Orlando | 73/49.2 |
| 3,589,948 | 6/1971 | Adams | 136/134 |
| 3,591,755 | 7/1971 | Cushman | 219/50 |
| 3,609,525 | 9/1971 | Clingerpeel | 324/29.5 |
| 3,642,117 | 2/1972 | Burt | 198/38 |
| 3,683,676 | 8/1972 | Hass | 73/45.1 |
| 3,684,088 | 8/1972 | Buttke | 209/75 |
| 3,785,195 | 1/1974 | Yasuhiro | 73/37 |
| 3,806,696 | 4/1974 | Young | 219/137 |
| 3,822,585 | 7/1974 | Toback | 73/49.2 |
| 3,883,744 | 5/1975 | Steffel | 250/360 |
| 3,908,739 | 9/1975 | Cushman | 164/80 |
| 3,909,300 | 9/1975 | Schenk, Jr. | 136/134 R |
| 3,954,216 | 5/1976 | Eberle | 228/51 |
| 3,980,126 | 9/1976 | Eberle | 164/271 |

Primary Examiner—Michael J. Tokar
Attorney, Agent, or Firm—Benasutti Associates, Ltd.

[57] ABSTRACT

A novel high rate battery testing apparatus and method are disclosed. The high rate terminal blocks are adjustably mounted to service batteries with various terminal posts spacings. After indexing and alignment, each battery to be processed is located and clamped by a high rate test head, to create high quality electrical contact with the terminal blocks of the apparatus, after which a load is connected across the battery terminals to effect the testing operation. The terminal blocks are preferably of the same configuration as the molding templates used to mold the battery terminals, thereby ensuring precise alignment and excellent contact between the battery terminals and the water cooled terminal blocks.

8 Claims, 3 Drawing Figures

HIGH RATE, BATTERY TESTING APPARATUS AND METHOD

CROSS REFERENCE TO RELATED APPLICATIONS

The present application is a continuation-in-part of my prior co-pending patent application Ser. No. 697,786, filed June 21, 1976 entitled, "Automated Post Burn Station" which in turn is a continuation of U.S. patent application Ser. No. 618,772, filed Oct. 2, 1975, now U.S. Pat. No. 3,980,126 entitled, "Automated Post Burn Station", which in turn is a continuation-in-part of Ser. No. 432,545, filed Jan. 11, 1974, now U.S. Pat. No. 3,954,216 entitled, "Apparatus For Thermal Relay Welding", which in turn is a continuation-in-part of U.S. patent application Ser. No. 395,528, filed Sept. 10, 1973, now U.S. Pat. No. 3,861,575, dated Jan. 21, 1975, which in turn is a division of application of U.S. Ser. No. 184,338, filed Sept. 28, 1971, now abandoned, which applications are specifically incorporated by reference as if fully set forth herein.

The present application is also a continuation-in-part of my prior co-pending patent application Ser. No. 770,889, filed Feb. 22, 1977 entitled, "Automatic Air Leak Testing Apparatus and Method", which in turn is a continuation of U.S. patent application Ser. No. 600,840, filed July 31, 1975, now U.S. Pat. No. 4,027,797, dated June 7, 1977 entitled, "Automatic Air Leak Testing Apparatus and Method" which is a division of application Ser. No. 475,273, filed May 31, 1974, now U.S. Pat. No. 3,938,368, which applications are incorporated by reference as if fully set forth herein.

The present application is also a continuation-in-part of my prior co-pending patent application entitled, "Automated Burnishing Apparatus and Method For Burnishing The Terminal Posts of Lead-Acid Batteries", Ser. No. 887,063, filed March 16, 1978, which application is also specifically incorporated herein by reference.

BACKGROUND OF THE INVENTION

The present invention generally relates to battery processing apparatuses. It also relates to apparatuses and methods which are used to "high-rate" test charged batteries, particularly automotive batteries.

Prior to the shipping of completed electric storage batteries, particularly automotive storage batteries, it is desirable to "high-rate" test those batteries by, in essence, shorting the positive and negative terminals of those batteries while measuring the current capacity of those batteries. This "high-rate" testing procedure is necessary since it is possible that various connections within the battery, such as intercell connections, may be cracked or otherwise be unsatisfactory such that the battery would be prevented from delivering its full capacity, as for example, under starting conditions when used in an automobile. By "high-rate" testing these batteries, deficient welds, connections, internal shorts, and other deficiencies within the battery will be reflected in the battery's inability to deliver "high-rate" discharge.

Currently, most batteries which are high rate tested are tested through a hand procedure wherein an operator holding two terminal connectors places those connectors over the terminal posts and activates the testing mechanism, whereby a preselected load is connected across the terminals for a preselected length of time. In the event that the battery being tested is faulty, the circuit will either open or the amount of current provided thereby will substantially decrease prior to the end of the test. The terminal connectors used for "high-rate" testing are generally cylindrical having axially tapered voids disposed in the ends thereof which are oversized with respect to the battery terminals. These voids are fitted over the terminals to be tested and the cylinders are "cocked" with respect to the axis of the terminals so that connections are made between the inner surfaces of the voids and the outer surfaces of the terminals. Unfortunately, while the leverage applied by the cylinders is usually sufficient to create a connection thereto, the "cocking" of the cylinders tends to mark the battery terminals and may additionally, if connections are not well made, cause arcing, sparking, or melting of the lugs of the battery terminal. In extreme instances the leverage applied could conceivably crack the terminal post-bushing welds. Since the voids are oversized with respect to the battery terminal and since the connections are placed down over those terminals, sparking or arcing particularly during "high-rate" discharge may ignite battery gases in the vicinity of the top of the battery cases, possibly with explosive consequences. Additionally, depending upon the capacity of the batteries being tested and the frequency of testing successive batteries, the battery terminal connections can heat up, thereby affecting the resistance or load which is effectively placed across the terminal connections. Consequently, with this type of testing apparatus it may be difficult to accurately compare the capacity of batteries tested at various times of the day and with various testing frequencies.

SUMMARY OF THE INVENTION

The present invention provides a novel apparatus and method for safely "high-rate" testing electric storage batteries. The preferred embodiment apparatus of the present invention sequentially processes batteries by aligning the terminals of those batteries under a plurality of water cooled terminal connection blocks having terminal post inserts fitted therein which are precisely sized to engage the exterior of the terminals, which are then automatically caused to seat around those terminals, after which the "high-rate" testing operation is automatically performed. In the preferred embodiment, the terminal blocks in are slidably mounted to accommodate various battery terminal spacings. The preferred embodiment battery terminal blocks seal the battery terminals with respect to the bottom of the blocks, leaving the top surfaces of the battery terminals open to the atmosphere, whereby the possibility of explosive ignition of battery gases in the vicinity of the case surface is substantially reduced. Following the "high-rate" testing operation, suitable batteries are permitted to proceed down the assembly line, while those batteries which are found not to be suitable are rejected to a secondary reject conveyor.

Accordingly, a primary object of the present invention is the provision of an automated apparatus for "high-rate" testing electric storage batteries.

Another aim of the present invention is the provision of a safe "high-rate" testing apparatus wherein arcing between the battery terminals and battery terminal connections is less likely to occur, and, if present, is less likely to cause ignition of battery gases in the vicinity of the battery cover.

A further object of the present invention is the provision of an automated "high-rate" testing apparatus with cooled battery terminal connections such that batteries may be rapidly and efficiently tested by insuring that a uniform resistance is connected across those batteries throughout the battery testing.

These and other objects of the present invention will become apparent from the following more detailed description.

DETAILED DESCRIPTION OF THE DRAWINGS

DESCRIPTION OF THE PREFERRED EMBODIMENT

Figure 1:
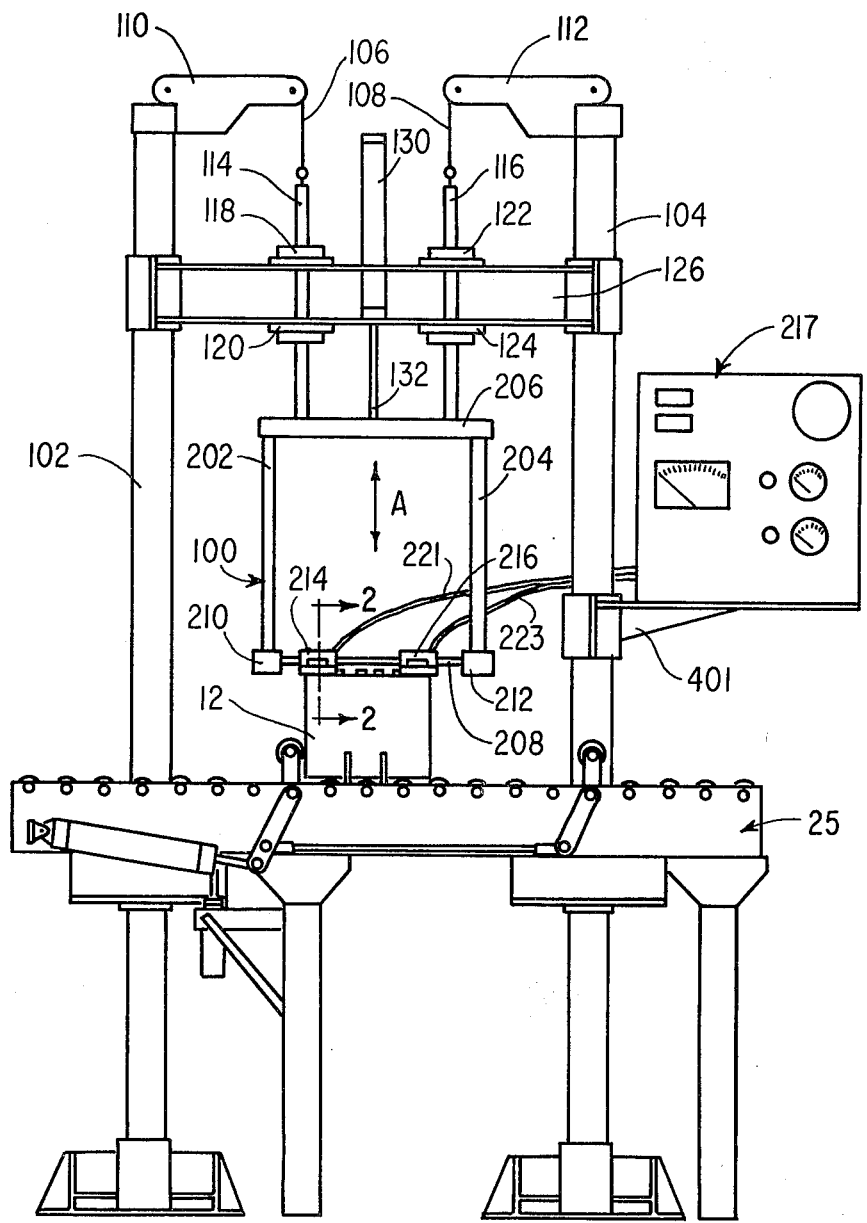
FIG. 1 is a front view of the preferred apparatus of the present invention.

Although specific forms of the invention have been selected for illustration in the drawings, and the following description is drawn in specific terms for the purpose of describing these forms of the invention, this description is not intended to limit the scope of the invention which is defined in the appended claims.

Referring now to the drawings, the automated "high-rate" testing apparatus of the present invention generally comprises a conveyor means for sequentially indexing and aligning automotive storage batteries, such as battery 12 in a battery processing position immediately under the battery processing head designated generally 100. The battery processing head 100 is supported by main supports 102 and 104. These main supports are hollow and have counter-weights disposed therein which, together, approximately equal the weight of the battery processing head 100. These counterweights are attached to cables 106 and 108 which are run across pulley mechanisms 110 and 112 and are attached to battery processing support rods 114 and 116 which are journalled within support rod bushings 118, 120, 122, and 124. These bushings are mounted on main transverse support member 126 which spans between main supports 102 and 104. The battery processing head 100 is caused to move generally towards and away from battery 12 by means of battery processing head cylinder 130 which is mounted on main transverse support member 126. Accordingly, relative movement of cylinder rod 132 with respect to cylinder 130 causes the relative movement of the battery processing head 100 in the directions as shown by double-headed arrow A in FIG. 1. As shown in FIG. 1, the battery processing head 100 is shown in the operating or testing position, but is retractable upon the withdrawal of cylinder rod 132 into a standby position away from battery 12.

As seen in FIG. 1, the battery processing head 100 generally comprises upright rods 202 and 204 which are spaced apart at either end by transverse supporting member 206 at the upper end and two parallel, transverse connecting rods 208 and 209 which span between union blocks 210 and 212 at the lower end. Slidably disposed on rods 208 and 209 are a plurality of terminal connecting blocks 214 and 216 which are mounted for movement along rods 208 and 209 into positions directly over the battery terminals to be contacted. Since the "high-rate" testing operation is, of course, conducted on charged batteries, the preferred embodiment apparatus of the present invention is fully insulated to insure that bridging cannot take place directly through the main body of the apparatus. Accordingly, insulating bushings 900 and 904 are utilized on each terminal connection block 214 and 216 to insulate those blocks from rods 208 and 209.

Terminal connecting blocks 214 and 216 are connected to a test cabinet designated generally 217 through connecting cables 221 and 223. The control cabinet is shown in FIG. 1 mounted on bracket 401 which is adjustably disposed along main support 104. The control cabinet is a conventional high rate test cabinet which, when triggered, places a preselected electrical load across the battery which measures the capacity and electrical integrity of the battery, for a predetermined length of time. The preferred embodiment conveyor mechanism designated generally 25, although not illustrated in detail in the drawings is preferably identical to that disclosed in my prior co-pending patent application Ser. No. 770,889, filed Feb. 22, 1977, entitled, "Automatic Air Leak Testing Apparatus and Method", which application has been specifically incorporated herein by reference. Additionally, although not illustrated in the drawings, one preferred embodiment of the present apparatus may incorporate in addition to the structure shown in the drawings, a locater template having a plurality of openings disposed thereon which mate with pins to relatively fix the locations of the terminal connecting blocks 214 and 216, as disclosed in my prior co-pending patent application entitled, "Automated Burnishing Apparatus and Method for Burnishing the Terminal Posts of Lead-Acid Batteries", Ser. No. 887,063, filed Mar. 16, 1978, and also more specifically described in my prior U.S. Pat. Nos. 3,861,575 and 3,942,704, which are hereby incorporated by reference. For this embodiment, it is important that all members coming in contact directly or indirectly with the terminal connection blocks be insulated from the remainder of the apparatus. In this regard, the preferred locater template material is Lexan TM acrylic polymer sheet, or some other similar type of insulating material which will, in any event, prevent the shorting of battery terminals directly through the main body of the apparatus.

Figure 2:
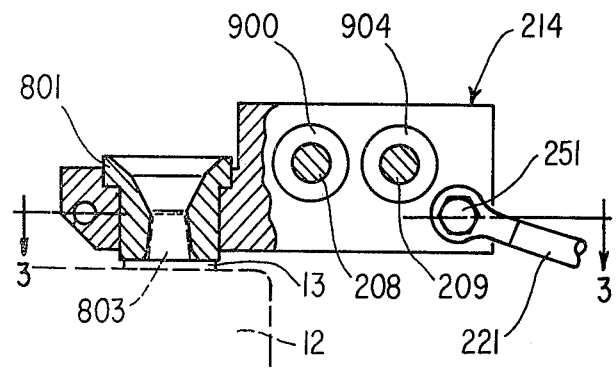
FIG. 2 is an enlarged, partial cross-section of the preferred embodiment battery terminal connection of the present apparatus, taken as indicated by the lines and arrows 2—2 in FIG. 1, a portion of the battery case and battery terminal being shown in phantom.

Referring now in particular to FIG. 2, which is a greatly enlarged side view of a portion of the battery terminal block 214 shown in FIG. 1, cable 221 may be seen to be bolted to a rear portion of the connecting block designated generally 214 by a conventional bolt 251. The battery terminal connecting block is substantially identical in configuration to the molds and mold carriage blocks disclosed in my prior co-pending application Ser. No. 697,786, filed June 21, 1976 entitled, "Automated Post Burn Station", with the exception that the interior surfaces of interchangeable terminal connecting insert 801 are not hard surfaced anodized, but are preferably polished aluminum or copper thereby insuring that excellent electrical contact will be established between the interior surfaces thereof and the outer surfaces of battery terminal posts 803. Superior contacts are accordingly achieved by utilizing the same insert construction (albeit with different interior finishes) to both molds, i.e., burn and test the battery terminals. As shown in FIG. 2, the lower surfaces of the terminal connecting inserts, such as insert 801, seat firmly upon the raised portions, such as raised portion 13, which surrounds the battery terminals, such as terminal 803 of battery 12. The portion of terminal post insert 801 which surrounds and seats down upon the battery terminal post 803 is precisely configured to the exterior surfaces of that post, but includes an entrance taper or level to aid in receiving the post as the insert is introduced down over the post. The outer surfaces of the terminal post insert 801 mateably engage a complementally defined bore in the terminal connecting block 214 such that an excellent heat transfer relationship is established between the insert 801 and the block 214. If desired, the effectiveness of the heat transfer relationship and/or the temperature of the inserts can be monitored by thermocouples mounted on the blocks which contact the inserts, as described in my prior U.S. Pat. No. 4,033,402, which is hereby incorporated by reference. Regardless of the size and configuration of the interior of each insert, the exterior dimensions of these inserts are standardized to mateably fit within the bores of the connecting blocks, thus providing quick interchangability process any of a variety of standard terminal sizes and locations.

Figure 3:
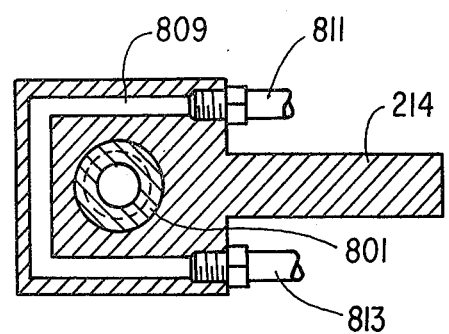
FIG. 3 is a cross-section of a portion of the battery terminal connection shown in FIG. 2, taken as indicated by the lines and arrows 3—3 in FIG. 2.

In FIG. 3, which is a cross-section of a portion of the block shown in FIG. 2, with the exception that cable 221 and bolt 251 have been omitted for purposes of clarity, the cooling channel 809 and its associated conduits 811 and 813 are provided to facilitate the constant circulation of a cooling fluid through the block, as for example through conduit 811 around conduit 809 and out of conduit 813 (or vice versa), which will act to cool block 214 which in turn will cool terminal connecting insert 801. Thus, regardless of the number of tests which are made in a given length of time, the terminal connecting inserts and terminal connecting blocks will be maintained at a uniform temperature and will accordingly not vary in the resistance imparted to the "high-rate" testing system.

From the above description it will be seen that a novel apparatus is provided which will efficiently "high-rate" test batteries in a safe, uniform manner. The batteries are introduced into a battery processing position, whereupon battery processing head 100 is moved from the standby to the operating or testing position whereupon appropriately configured terminal connecting inserts seat down around and over the battery terminals to essentially create a seal between the lower surfaces of the terminal connecting insert and the surrounding raised portion 13 of the battery case. Accordingly, arcing which may occur between battery terminal 803 and the interior surfaces of 801 will not take place in the immediate atmospheric vicinity to the top surface of the battery case, thereby minimizing the chances of ignition of battery gases which may be generated during the testing operation. Constant cooling of the terminal connecting insert and terminal connecting blocks facilitates uniform testing regardless of the number of tests conducted during a given testing. In the event that the battery is found to be unacceptable, the battery testing head is automatically retracted and the battery is moved on to a reject conveyor. Alternatively, if the battery is found to be acceptable, the battery is permitted to pass to the next battery processing station. As disclosed in connection with my aforementioned pending patent applications and U.S. Patents which are incorporated herein, provision is made to insure that the battery terminal connecting blocks 214 and 216 fully seat on the top of the battery case around the terminals to establish the aforementioned seal around those terminals prior to the beginning of the testing operation. By insuring that the head is in the full down position, premature testing of the battery terminals is prevented and the operational safety of the apparatus is increased.

It will be understood that various changes in the details, materials and arrangement of parts which have been herein described and illustrated in order to explain the nature of this invention may be made by those skilled in the art within the principle and scope of the invention as expressed in the following claims.

It will be further understood that the "Abstract of the Disclosure" set forth above is intended to provide a non-legal technical statement of the contents of the disclosure in compliance with the Rules of Practice of the United States Patent and Trademark Office, and is not intended to limit the scope of the invention described and claimed herein.

What is claimed is:

1. An apparatus for "high-rate" testing storage batteries of the type having a case and at least one terminal extending therethrough, said apparatus comprising:
   (a) A work surface for supporting batteries to be tested;
   (b) a frame associated with said work surface;
   (c) a battery processing head mounted on said frame for reciprocal movement with respect to said frame between at least standby and battery testing positions;
   (d) battery terminal connecting means mounted on said head for establishing electrical contact with said battery terminals upon movement of said head to said battery testing position, said battery terminal connecting means comprising at least one battery terminal connecting block mounted on said battery processing head for slideable movement with respect to said head along an axis transverse to the axis of reciprocation of said head, said battery terminal connecting block adapted to mateably receive at least one battery terminal post insert, said battery terminal post insert having a lower surface defined thereon to create an air tight seal between said insert and at least a portion of the battery case disposed adjacent to said battery terminal post; and
   (e) high rate testing means electrically connected to said battery terminal connecting means for selectively "high-rate" testing each of said batteries when said batteries are electrically connected thereto through said battery terminal connecting means.

2. The invention of claim 1 wherein said battery terminal connecting means further comprises at least one battery terminal connecting block, said battery terminal connecting block having cooling means associated therewith for maintaining a constant temperature of said block during testing.

3. The invention of claim 2 wherein said battery terminal connecting block further comprises means for receiving a battery terminal post insert, said battery terminal post insert being substantially disposed within a bore formed through said block in direct heat transfer relationship to said block, whereby cooling of said block additionally cools said battery terminal connecting insert.

4. The invention of claim 2 wherein said battery terminal connecting block is electrically insulated with respect to said battery processing head.

5. A method of "high-rate" testing electric storage batteries comprising the steps of:
   (a) introducing an electric storage battery into a battery processing position;
   (b) simultaneously bringing a plurality of spaced apart battery terminal connections into contact with the battery terminals of said battery in said processing position;
   (c) maintaining the temperature of said connections at a preselected temperature to standardize the electrical resistance of those connections; and
   (d) placing a preselected electrical load across said battery through said connections for a predetermined length of time while determining the electrical integrity and capacity thereof to thereby "high-rate" test said battery.

6. A method of "high-rate" testing electric storage batteries comprising the steps of:
   (a) introducing an electric storage battery into a battery processing position;
   (b) introducing mateably configured battery terminal connections over each of the terminals of the batteries to contact the exterior surfaces of those terminals, said connections being applied to create a gas-tight seal around said battery terminals against at least a portion of the battery case adjacent to said terminals; and
   (c) maintaining said gas-tight seal while placing a preselected electrical load across said battery through said connections for a predetermined length of time while determining the electrical integrity of said battery to thereby "high-rate" test said battery.

7. The method of claim 5 wherein the mateably configured battery connections are substantially identical in construction to the molds utilized to shape said terminals during the initial burning of said terminals.

8. The invention of claim 3 wherein said connecting means comprises a plurality of said blocks having substantially identical bores formed therein, said inserts being removably mounted within said blocks to facilitate the interchange of said inserts to accommodate batteries having various terminal sizes and positions.

* * * * *